United States Patent
Yun

(10) Patent No.: US 8,030,117 B2
(45) Date of Patent: Oct. 4, 2011

(54) IMAGE SENSOR AND METHOD FOR MANUFACTURING THE SAME

(75) Inventor: Young Je Yun, Ansan-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/566,530

(22) Filed: Sep. 24, 2009

(65) Prior Publication Data

US 2010/0015748 A1    Jan. 21, 2010

Related U.S. Application Data

(62) Division of application No. 11/980,014, filed on Oct. 29, 2007, now Pat. No. 7,611,922.

(30) Foreign Application Priority Data

Nov. 13, 2006  (KR) .................. 10-2006-0111450
Nov. 21, 2006  (KR) .................. 10-2006-0115487

(51) Int. Cl.
*H01L 21/00*     (2006.01)
(52) U.S. Cl. ..... 438/70; 438/10; 438/199; 257/E27.133; 257/E25.032
(58) Field of Classification Search ............ 438/10, 438/70, 199; 257/E27.133, E25.032
See application file for complete search history.

(56) References Cited

U.S. PATENT DOCUMENTS

| | | | |
|---|---|---|---|
| 7,388,270 B2 * | 6/2008 | Lee | 257/440 |
| 7,449,357 B2 | 11/2008 | Kim et al. | |
| 2004/0147059 A1 | 7/2004 | Jeong et al. | |
| 2006/0113622 A1 | 6/2006 | Adkisson et al. | |
| 2006/0124948 A1 | 6/2006 | Lee | |
| 2006/0138412 A1 * | 6/2006 | Park | 257/53 |

FOREIGN PATENT DOCUMENTS

KR    10-2005-0103772 A    11/2005

OTHER PUBLICATIONS

Eun Ji Kim; "Double-Lens Image Sensor with Additional Micro Lens and Manufacturing Method Thereof", Publication No. 1020050103772 A; Publication Date Nov. 1, 2005; Korean Patent Abstracts; Korean Intellectual Property Office, Republic of Korea.

* cited by examiner

*Primary Examiner* — Michelle Estrada
(74) *Attorney, Agent, or Firm* — The Law Offices of Andrew D. Fortney; Andrew D. Fortney

(57) ABSTRACT

A method for manufacturing an image sensor includes forming first to third photodiodes and first to third color filters corresponding thereto; forming a photoresist film including photosensitive materials on the upper surfaces of the first to third color filters; forming a first exposed part by exposing the photoresist film with a first exposure energy using a first pattern mask with a first light transmitting part having a first width at boundaries between the individual color filters; forming a second exposed part overlapping a portion of the first exposed part by exposing the photoresist film with a second exposure energy smaller than the first exposure energy using a second pattern mask with a second light transmitting part having a second width wider than the first width; and forming microlenses by developing the photoresist film.

18 Claims, 8 Drawing Sheets

IMAGE SENSOR AND METHOD FOR MANUFACTURING THE SAME

The present application is a divisional of U.S. patent application Ser. No. 11/980,014, filed on Oct. 29, 2007, now U.S. Pat. No. 7,611,922 which claims priority under 35 U.S.C. 119 and 35 U.S.C. 365 to Korean Patent Application No. 10-2006-0111450 (filed on Nov. 13, 2006) and 10-2006-0115487 (filed on Nov. 21, 2006), all of which are hereby incorporated by reference in their entireties.

BACKGROUND

The present invention relates to an image sensor and a method for manufacturing the same.

An image sensor is defined as a semiconductor device converting an optical image into an electrical signal. As the image sensor, a charge coupled device (CCD) and a CMOS image sensor, etc. are representative.

The CMOS image sensor comprises a plurality of pixels arranged in a pixel region to detect light quantity and a microlens corresponding to a pixel in order to condense light using the pixel.

SUMMARY

Embodiments of the invention provide an image sensor and a method for manufacturing the same that reduces a gap between microlenses, and/or spherical aberration(s) of the microlens.

A method for manufacturing an image sensor according to one embodiment may comprise the steps of: forming first to third photodiodes and first to third color filters corresponding to the first to third photodiodes; forming a photoresist film including photosensitive materials on the upper surfaces of the first to third color filters; forming a first exposed part by exposing (or irradiating) the photoresist film with a first exposure energy using a first pattern mask having a first light transmitting part with a first width at a first boundary between the first color filter and the second color filter and at a second boundary between the second color filter and the third color filter; forming a second exposed part overlapping a portion of the first exposed part by exposing (or irradiating) the photoresist film with a second exposure energy smaller than the first exposure energy, using a second pattern mask having a second light transmitting part with a second width wider than the first width at the first and second boundaries; and forming a microlens by developing the photoresist film.

A method for manufacturing an image sensor according to another embodiment comprises the steps of: forming first to third photodiodes and first to third color filters corresponding to the first to third photodiodes; forming a photoresist film including photosensitive materials on the upper surfaces of the first to third color filters; focus-exposing the photoresist film by using a pattern mask having a light transmitting part corresponding to a first boundary between the first color filter and the second color filter and at a second boundary between the second color filter and the third color filter; defocus-exposing the focus-exposed photoresist film using the pattern mask; and forming microlenses by developing the focus-exposed and defocus-exposed photoresist films.

A method for manufacturing an image sensor according to yet another embodiment comprises the steps of: forming first to third photodiodes and first to third color filters corresponding to the first to third photodiodes; forming a photoresist film including photosensitive materials on the upper surfaces of the first to third color filters; patterning the photoresist film using a plurality of light transmitting parts in concentric circles over a respective color filter, located between the edge and the center of the respective color filter; and forming microlenses by developing the exposed photoresist film.

A method for manufacturing an image sensor according to another embodiment comprises the steps of: forming first to third photodiodes and first to third color filters corresponding to the first to third photodiodes; forming a first photoresist film having a first sensitivity for light on the upper surfaces of the first to third color filters; forming a second photoresist film having a second sensitivity for light higher than the first sensitivity on the first photoresist film; and forming microlenses by patterning the first and second photoresist films using one or more pattern masks such that the patterned first photoresist film has a first area and the patterned second photoresist film has a second area smaller than the first square area.

An image sensor may comprise photodiode structures in a pixel region of a semiconductor substrate, configured to generate electrical signals from received incident light; and aspherical microlenses arranged on or over the photodiode structures. Typically, the image sensor contains the same number of aspherical microlenses as it has photodiode structures.

DETAILED DESCRIPTION OF THE EMBODIMENTS

Hereinafter, an image sensor and a method for manufacturing the same according to the embodiment will be described in detail with reference to the accompanying drawings.

First Embodiment

Figure 1:
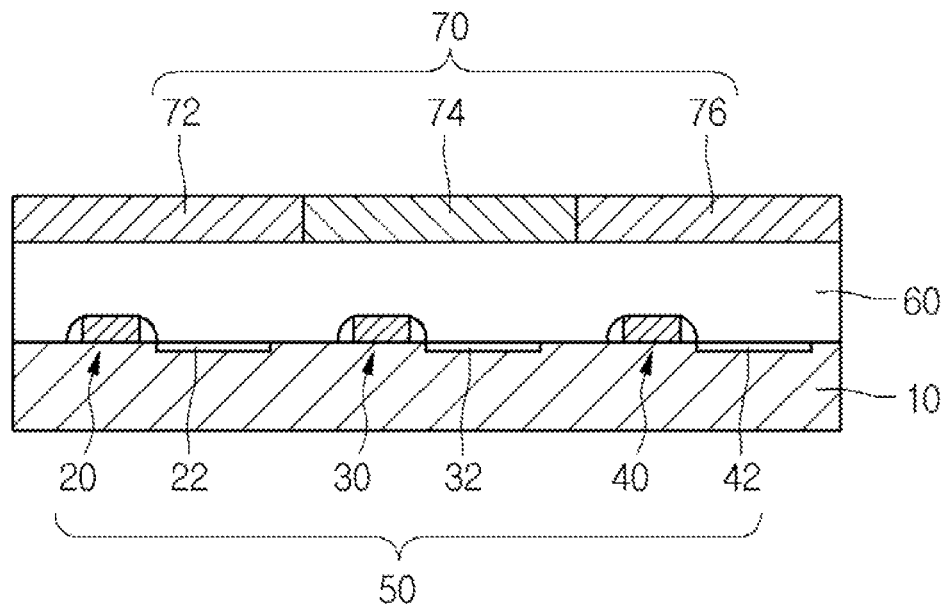
FIG. 1 is a cross-sectional view showing a photodiode structure, an insulating layer structure, and a color filter.

FIG. 1 is a cross-sectional view showing photodiode structures, an insulating layer structure, and a color filter layer 70. Typically, the individual color filters 72, 74 and 76 correspond to the color processing system of the image sensor (e.g., red, green and blue color filters [i.e., the RGB system] or yellow, cyan and magenta color filters [i.e., the YCM system]).

Referring to FIG. 1, in order to manufacture an image sensor, first, a plurality of photodiode structures in a pixel region 50, including first to third photodiode structures (e.g., 20, 30, and 40), are formed on a semiconductor substrate 10. As is readily apparent to one skilled in the art, pixel region 50 includes one or more (preferably a plurality of) individual pixels, each containing a single photodiode 22, 32, or 42.

Although three photodiode structures 20, 30, and 40 are shown as the photodiode structure 50, a plurality of photodiode structures 50 may be arranged on the substrate 10 corresponding to the resolution. The first to third photodiode structures 20, 30, and 40 each include the first to third photodiodes 22, 32, and 42.

Figure 2:
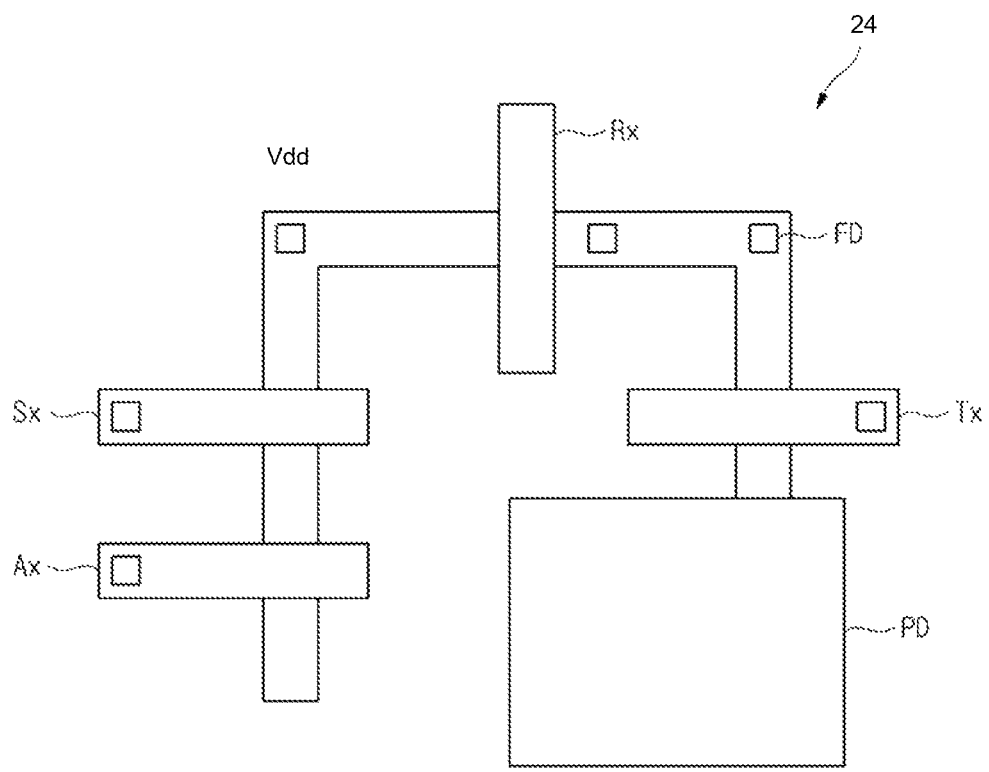
FIG. 2 is a plan view showing an exemplary unit pixel containing one of the photodiode structures as shown in FIG. 1.
Figure 3:
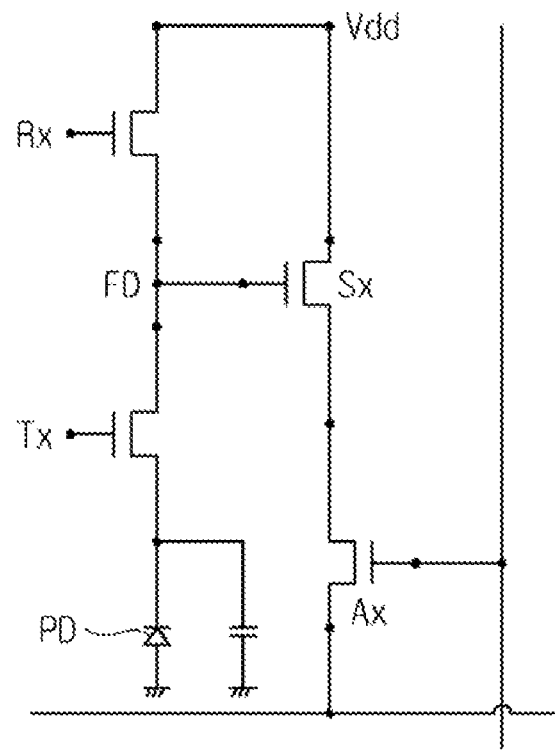
FIG. 3 is a circuit diagram of the unit pixel shown in FIG. 2.

FIG. 2 is a plan view showing a unit pixel 24, including a first photodiode structure PD (e.g., 22, 32 or 42 of the photodiode structures as shown in FIG. 1), and FIG. 3 is a circuit diagram of the unit pixel of FIG. 2.

Referring to FIGS. 1, 2 and 3, the first photodiode structure 20 or unit pixel 24 comprises a photodiode PD sensing light quantity and a transistor structure. The transistor structure comprises a transfer transistor Tx, a reset transistor Rx, a select transistor Sx, and an access transistor Ax.

The transfer transistor Tx and the reset transistor Rx are connected to the photodiode PD in series. One source/drain terminal (typically the source) of the transfer transistor Tx is connected to the photodiode PD, and the other source/drain terminal (typically the drain) of the transfer transistor Tx is connected to the source of the reset transistor Rx. A power supply voltage Vdd is applied to the drain of the reset transistor Rx.

The drain of the transfer transistor Tx serves as a floating diffusion layer FD. The floating diffusion (FD) layer is connected to the gate of the select transistor Sx. The select transistor Sx and the access transistor Ax are connected in series. In other words, the source of the select transistor Sx and the drain of the access transistor Ax are connected to each other.

The power voltage Vdd is applied to the drain of the select transistor Sx and the source of the reset transistor Rx. The drain of the access transistor Ax corresponds to an output terminal Out, and the gate of the access transistor Ax is connected to a select signal.

The operation of the first photodiode structure 20 having the structure as described above will be briefly described. First, the potential of the floating diffusion (FD) layer equalized to the power voltage Vdd by turning on the reset transistor Rx and then the reset transistor Rx is turned off. Such an operation is defined as a reset operation.

If external light is incident on the photodiode PD, electron-hole pairs (EHP) are generated within the photodiode PD so that the signal charges accumulate within the photodiode PD. Then, as the transfer transistor Tx is turned on, the signal charges accumulated within the photodiode PD are output to the floating diffusion layer FD to be stored in the floating diffusion (FD) layer.

Accordingly, the potential of the floating diffusion (FD) layer changes in proportion to the amount of charge output from the photodiode PD and thereby, the potential of the gate of the select transistor Sx is changed. At this time, if the access transistor Ax is turned on by means of the select signal Row, data is output to the output terminal Out.

After the data is output, the reset operation is performed again. The respective photodiode structures 50 including the first photodiode structure 20 repeat such processes and thereby convert light into electrical signals for output (e.g., to a display device).

After the photodiode structure 50 is formed on the semiconductor substrate 10, an insulating layer structure 60 is formed on the semiconductor substrate 10. The insulating structure 60 can include an oxide (e.g., silicon dioxide, doped with fluorine or boron and/or phosphorous, a silicon-rich oxide, or a [hydrogenated] silicon oxycarbide [e.g., SiOC and/or SiOCH]), an insulating nitride (e.g., silicon nitride), an oxynitride (e.g., silicon oxynitride), or a layered combination thereof. In the latter case, a wiring structure (not shown) may be formed in an insulating layer, or between insulating layers, in insulating layer structure 60. In the embodiment of FIG. 1, the insulating layer structure 60 may be included in the photodiode structure 50.

A color filter layer 70 is formed on the insulating layer structure 60. The color filter layer 70 includes, for example, a red color filter 72 selectively transmitting light of red wavelength, a green color filter 74 selectively transmitting light of green wavelength, and a blue color filter 76 selectively transmitting light of blue wavelength. In the embodiment of FIG. 1, the red, green, and blue color filters 72, 74, and 76 may have the same thickness or different thicknesses.

Figure 4:
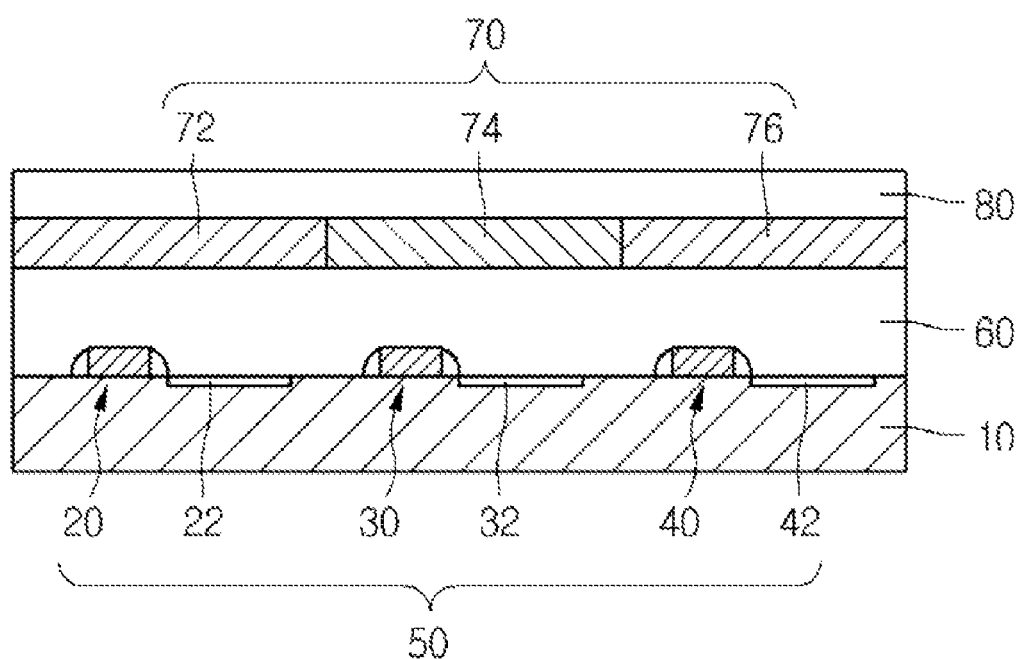
FIG. 4 is a cross-sectional view showing a photoresist film on the structure of FIG. 2.

FIG. 4 is a cross-sectional view showing the formation of a photoresist film on the color filter as shown in FIG. 1.

Referring to FIG. 4, after the color filter layer 70 is formed on the insulating layer structure 60, a photoresist film 80 including one or more photosensitive materials is deposited (typically by liquid phase deposition or spin-coating) on the color filter layer 70.

In the embodiment of FIG. 4, the photosensitive material(s) may comprise positive type photosensitive materials (e.g., where cross-linking is reduced by light). Alternatively, the photosensitive material(s) may comprise negative type photosensitive materials (e.g., where cross-links are formed by light).

Figure 5:
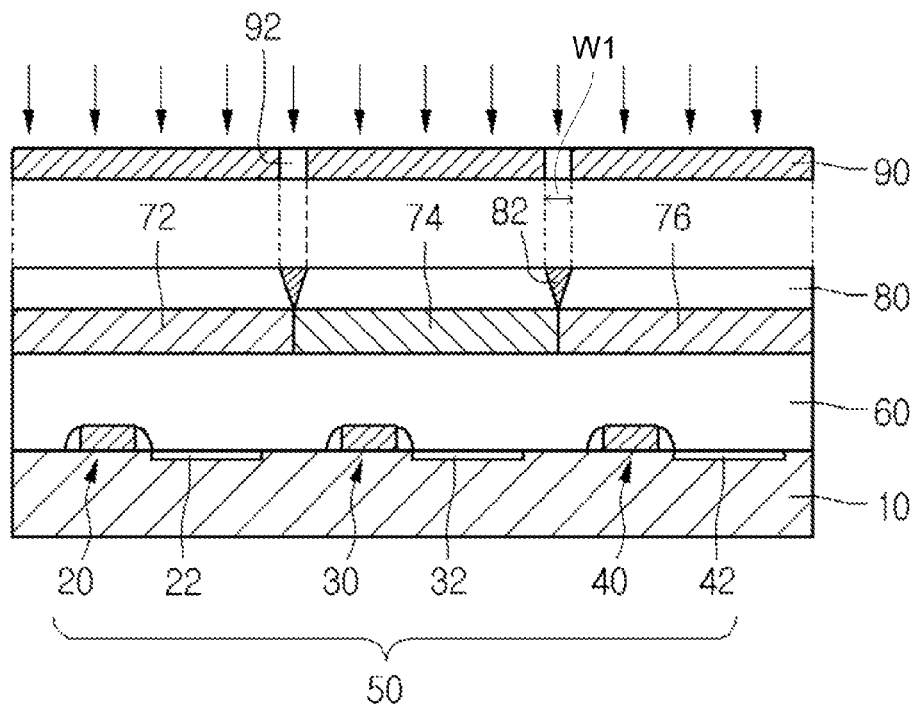
FIG. 5 is a cross-sectional view showing a first exposure of the photoresist film shown in FIG. 4.

FIG. 5 is a cross-sectional view showing a first exposure of the photoresist film of FIG. 4.

Referring to FIG. 5, after the photoresist film 80 is formed, a first pattern mask 90 is aligned on the photoresist film 80. The first pattern mask 90 has a first light transmitting part 92. In the embodiment of FIG. 5, the first light transmitting part 92 has a first width W1. The first light transmitting part 92 is formed on the mask 90 at a location corresponding to the boundaries between first color filter 72 and second color filter 74, and between the second color filter 74 and third color filter 76.

In the embodiment of FIG. 5, after the first pattern mask 90 is aligned on or over the photoresist film 80, the photoresist film 80 is exposed to light transmitted through the first light transmitting part 92 of the first pattern mask 90, so that a first exposed part 82 is formed on the photoresist film 80.

In the embodiment of FIG. 5, the light transmitted through the first light transmitting part 92 has a first exposure energy, and the first exposed part 82 is formed (e.g., from the upper surface of the photoresist film 80, where the first exposed part 82 may have a relatively large width, to the lower surface opposite to the upper surface, where the first exposed part 82 may have a relatively small width) by means of the first exposure energy. Alternatively and/or additionally, the first exposed part 82 has a profile and/or slope controlled by the focus profile of the light passing through the first light transmitting part 92 of mask 90.

Figure 6:
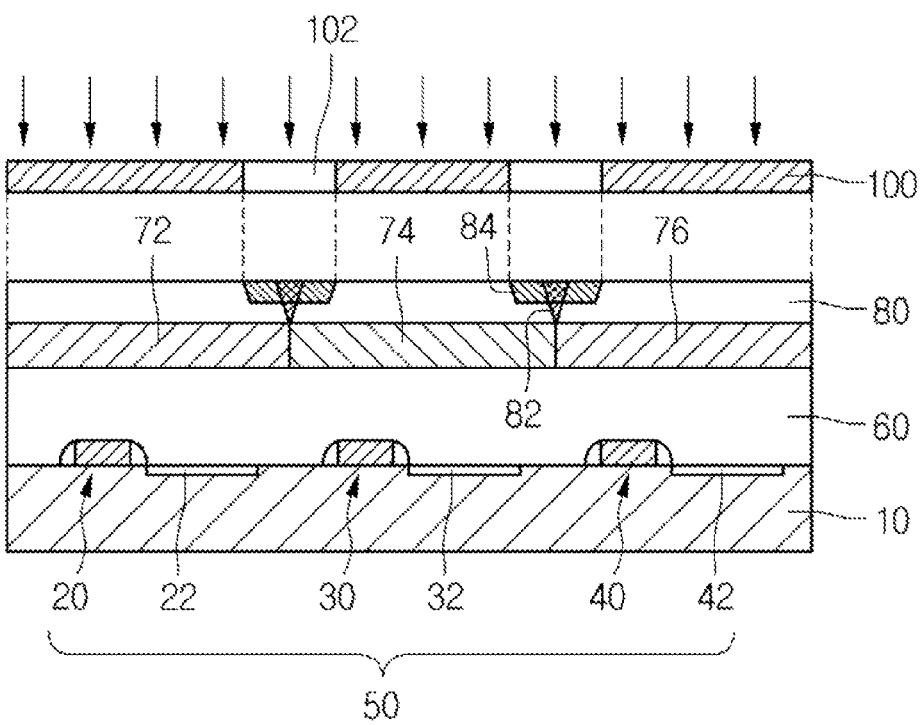
FIG. 6 is a cross-sectional view showing a second exposure of the photoresist film shown in FIGS. 4-5.

FIG. 6 is a cross-sectional view showing a second exposure of the photoresist film shown in FIG. 5.

Referring to FIG. 6, after the first exposed part 82 is formed in the photoresist film 80, a second pattern mask 100 is aligned on or over the photoresist film 80. The second pattern mask 100 has a second light transmitting part 102. In the embodiment of FIG. 6, the second light transmitting part 102 has a second width W2 that is larger than the first width W1. The second light transmitting part 102 is formed on the mask 90 at a location corresponding to the boundaries between first color filter 72 and second color filter 74, and between the second color filter 74 and third color filter 76.

In the embodiment of FIG. 6, the light transmitted through the second light transmitting part 102 has a second exposure energy that may be of from 40% to 60% of the first exposure energy. In the embodiment of FIG. 6, for example, the second exposure energy may be 50% of the first exposure energy.

A second exposed part 84 is formed by means of the second exposure energy. The second exposing part 84 overlaps the first exposed part 82 and has a shallower or smaller thickness and a wider or greater width than the first exposed part 82. Alternatively and/or additionally, the second exposed part 102 has a profile, depth and/or slope controlled by the focus profile and/or energy of the light passing through the second light transmitting part 102 of second mask 100. For example, the depth of the second exposed part 102 may be from 30 to 70%, 40 to 60%, or in one example, about 50%, of the thickness of the photoresist film 80.

Figure 7:
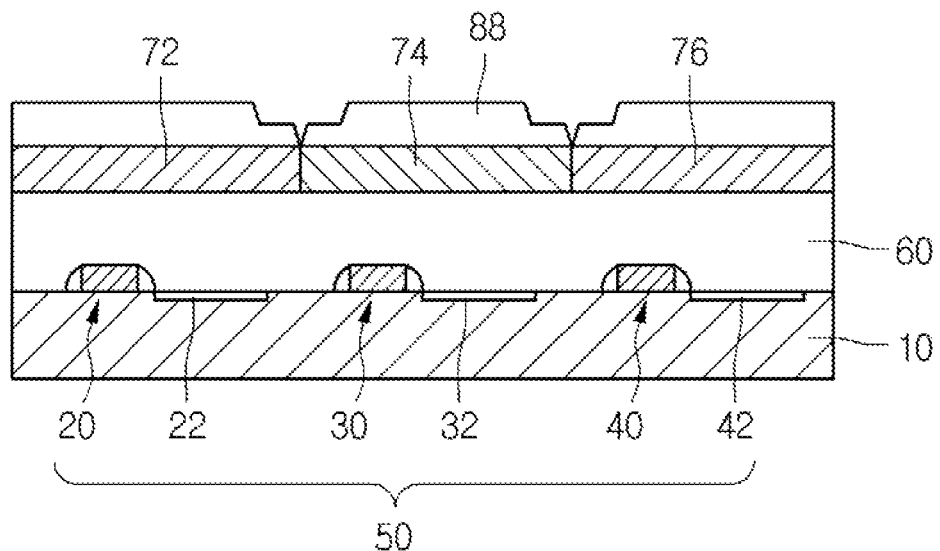
FIG. 7 is a cross-sectional view showing the (at least partial) formation of one or more microlenses by developing the photoresist film as shown in FIG. 6.

FIG. 7 is a cross-sectional view of the formation of microlenses (or microlens precursors) by developing the photoresist film shown in FIG. 6.

Referring to FIG. 7, after the second exposed part 84 is formed, the photoresist film is developed using a conventional developer so that the first and second exposed parts 82 and 84 are removed by the developer, forming a microlens or microlens precursor 88 on the respective color filter (e.g., 74). After the microlens 88 is formed, a reflow process can be performed on the microlens (precursor) 88 to form the final microlens.

The present method enjoys particular advantages and/or benefits over a conventional single-exposure process through a mask similar to one of the masks 90 or 100. For example, control of the photolithographic exposure/irradiation process is generally easier than control of the thermal reflow process. Thus, margins are generally improved by the present method, and as a result, the present process enables easier control of the thermal reflow process for forming the final microlenses.

Also, an object of the present method is to provide a microlens precursor that has a shape more similar to the final microlens shape than that provided by a conventional one-mask process. Consequently, one may replace the second mask 100 with second and third masks, where the second mask has an intermediate width (greater than W1) and an intermediate depth (less than the depth of the first exposed part 82), and the third mask has a largest width (greater than the intermediate width) and an shallowest depth (less than the intermediate depth).

Second Embodiment

Figure 8:
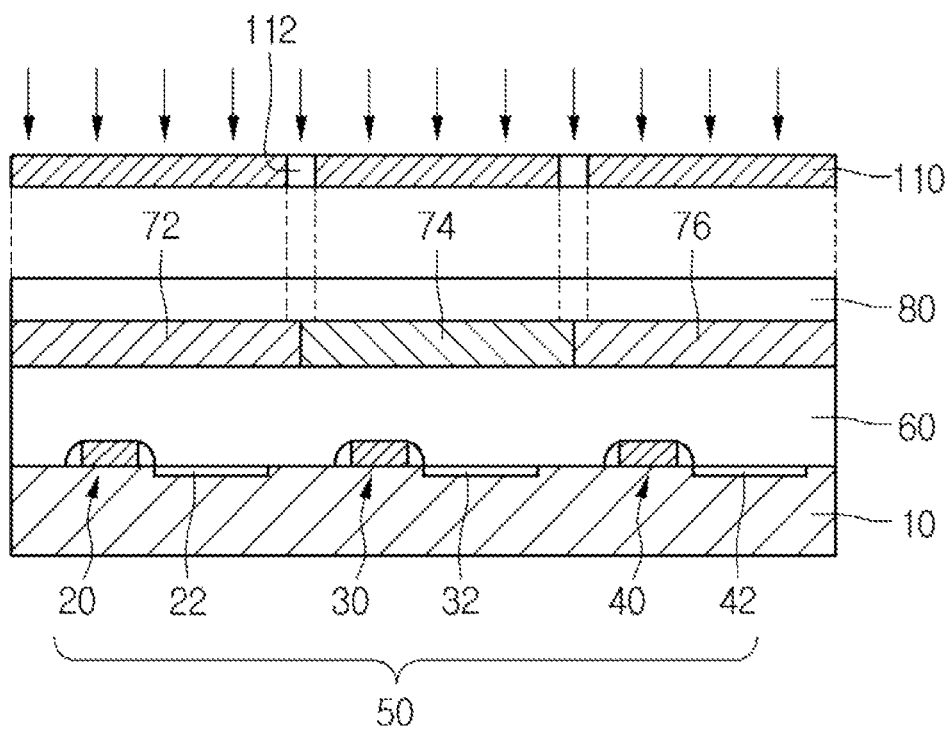
FIG. 8 is a cross-sectional view showing an alignment of a pattern mask on or over a photoresist film according to a second embodiment.

FIG. 8 is a cross-sectional view of the alignment of a pattern mask on the photoresist film according to the second embodiment. In the method for manufacturing the image sensor according to the second embodiment, the step forming a photoresist structure 50, an insulating layer structure 60, a color filter 70, and a photoresist film 80 is substantially the same as the embodiment as described above and thus, the explanation thereof will be omitted herein. Also, for the same constituents, the same reference numerals and terms will be given.

Referring to FIG. 8, a pattern mask 110 is aligned on a photoresist film 80 including positive type photo sensitive materials. The pattern mask 110 has a light transmitting part 112.

In the second embodiment, the light transmitting part 112 is formed on the mask 110 at a location corresponding to the boundaries between first and second color filters 72 and 74, and between second and third color filters 74 and 76.

Figure 9:
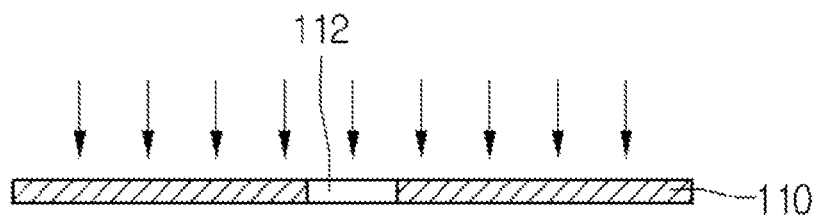
FIG. 9 shows an exposure profile of a photoresist film when the photoresist film is focus-exposed through the pattern mask shown in FIG. 8.
Figure 9:
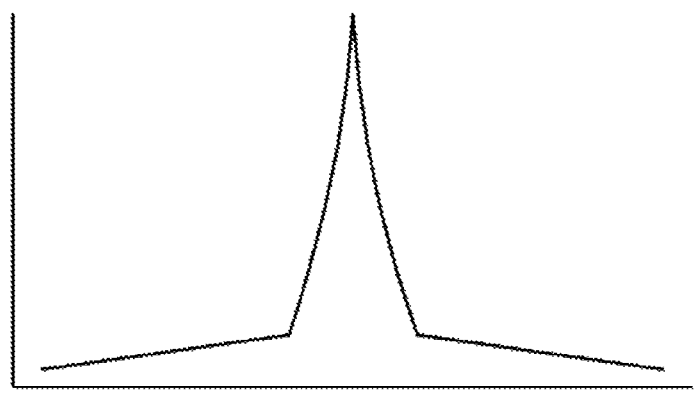
Figure 10:
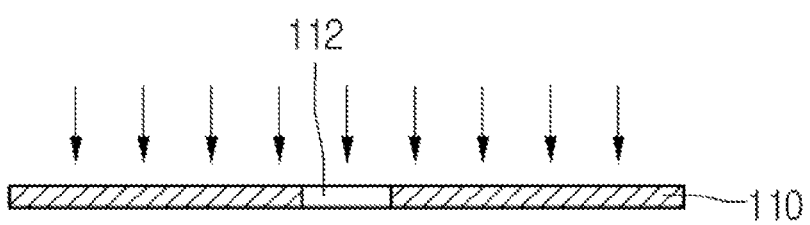
FIG. 10 shows an exposure profile of a photoresist film when the photoresist film is defocus-exposed through the pattern mask shown in FIG. 8.
Figure 10:
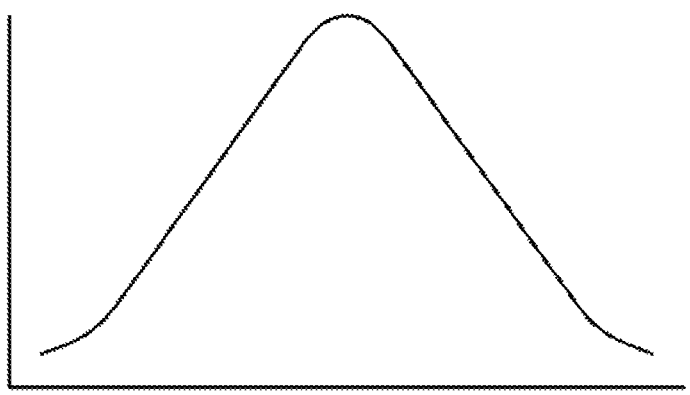

FIG. 9 shows an exposure profile of a photoresist film when the photoresist film is focus-exposed through the pattern mask 110 shown in FIG. 8, and FIG. 10 shows an exposure profile of a photoresist film when the photoresist film is defocus-exposed through the pattern mask 110 shown in FIG. 8.

Referring to FIGS. 8 to 10, after the pattern mask 110 is aligned on the photoresist film 80, the photoresist film 80 is first focus-exposed using light having a first exposure energy. As the photoresist film 80 is focus-exposed, the first exposed part (e.g., similar to exposed part 82 in FIG. 5) is primarily exposed so that it has a relatively deep depth and a relatively narrow width.

Thereafter, the photoresist film 80 is defocus-exposed using light having a second exposure energy, but using the same pattern mask 110. As the focus-exposed photoresist film 80 is defocus-exposed, the photoresist film 80 is again exposed to light over a relatively wide width as compared to the focused exposure.

In the second embodiment, preferably the first exposure energy in the focused exposure and the second exposure energy in the defocused exposure are about half (e.g., from 40 to 60%) of the exposure energy for fully exposing the photoresist film 80.

As described above, the microlens is formed by forming the photoresist film 80 by developing the photoresist layer 80 with a conventional developer after being focus-exposed and defocus-exposed, wherein the microlens formed in such a manner can greatly improve the resolution between adjacent microlenses. Alternatively, the focus-exposing and defocus-exposing steps can be reversed, without significant adverse effects.

Third Embodiment

Figure 11:
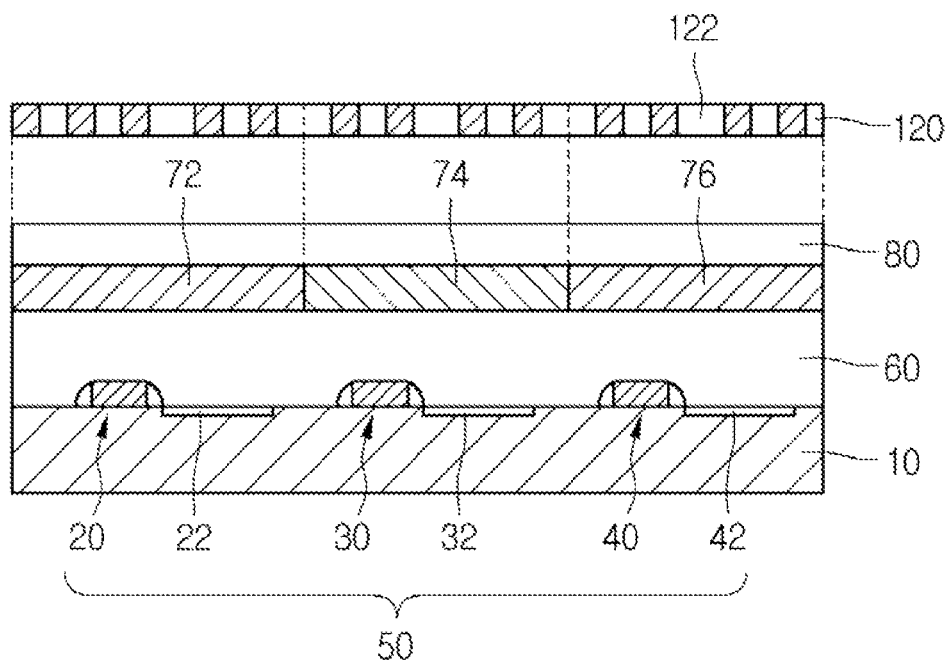
FIG. 11 is a cross-sectional view showing an alignment of a pattern mask on or over a photoresist film according to a third embodiment.

FIG. 11 is a cross-sectional view of the alignment of a pattern mask 120 on or over the photoresist film 80 according to a third embodiment. In the method for manufacturing the image sensor according to the third embodiment, the step forming a photodiode structure 50, an insulating layer structure 60, a color filter layer 70, and a photoresist film 80 is substantially the same as the other embodiments described above, and thus, the overlapping explanation thereof will be omitted herein. Also, for the same constituents, the same reference numerals and terms will be used.

Referring to FIG. 11, a pattern mask 120 is aligned on or over the upper surface of the photoresist film 80. In this embodiment, the pattern mask 120 has a plurality of light transmitting parts 122. In one embodiment, the plurality of light transmitting parts 122 are formed in concentric rings over each of the color filters 72, 74 and 76, from the center parts of the respective first to third color filters 72, 74, and 76 towards the edges of the first to third color filters 72, 74, and 76, and/or vice versa.

In this embodiment, about three to five light transmitting parts 122 corresponding to one color filter are formed in concentric circles, wherein the gap between the light transmitting parts 122 may be from 150 nm to 200 nm. Meanwhile, the width of the respective light transmitting parts 122 may be continuously and/or intermittently wider as a function of the distance from the edge of the color filter the center of the respective color filter (e.g., 72, 74 or 76).

Figure 12:
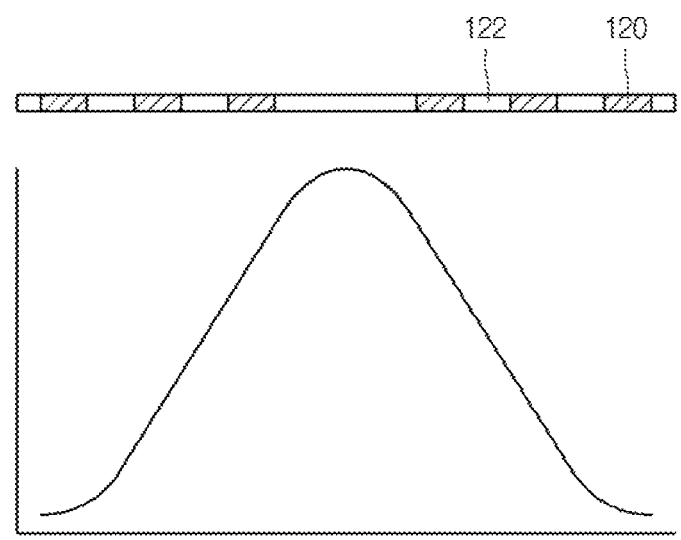
FIG. 12 shows an exposure profile of a photoresist exposed to light transmitted through the pattern mask shown in FIG. 11 or 12.

FIG. 12 is a graph showing an exposure profile of a photoresist by means of the light transmitted through the light transmitting parts of the pattern mask shown in FIGS. 11 and/or 12.

Referring to FIG. 12, a plurality of light transmitting parts 122 of the pattern mask 120 are formed in a region corresponding to one color filter, and the width of the light transmitting parts 122 may increase the closer the light transmitting part 122 is to the center of the color filter (or the further the light transmitting part is from the edge of the color filter). Thereafter, the photoresist pattern is exposed and developed using the light transmitting parts 122 of the mask 120, making it possible to form an excellent microlens on the color filter.

In various implementations, the light transmitting part 122 over the center of the color filter region of the mask 120 has a width of from about 20% to about 40% of the entire width of the color filter region of the mask 120. In general, the thinner the microlens, the larger the width of the center light transmitting part 122, and the thicker the microlens, the smaller the width of the center light transmitting part 122. However, the outermost light transmitting part(s) 122 may have a width as small as the resolution limit of the mask 120.

Fourth Embodiment

Figure 13:
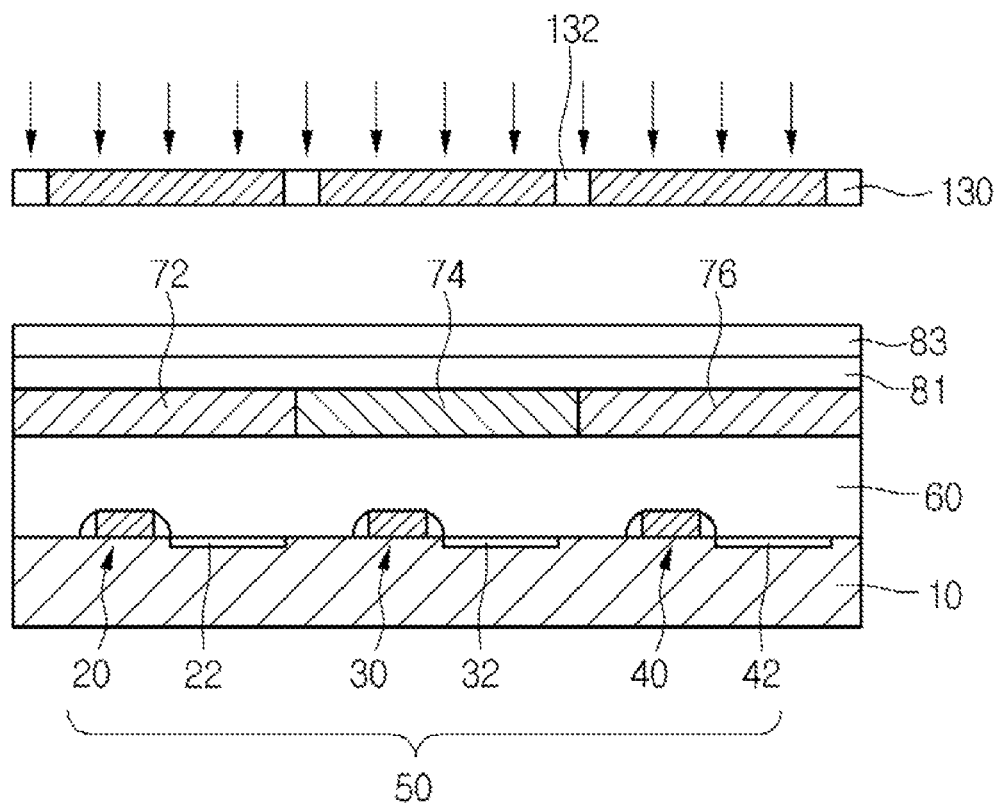
FIG. 13 is a cross-sectional view showing an alignment of a pattern mask on a bilayer photoresist film according to a fourth embodiment.

FIG. 13 is a cross-sectional view of the alignment of a pattern mask 130 on or over photoresist films (e.g., 81 and 83) according to a fourth embodiment. In the method for manufacturing the image sensor according to the fourth embodiment, the step forming a photodiode structure 50, an insulating layer structure 60, and a color filter layer 70 is substantially the same as the embodiments described above, and thus, the overlapping explanation thereof will be omitted herein. Also, for the same constituents, the same reference numerals and terms will be given.

Referring to FIG. 13, a first photoresist film 81 and a second photoresist film 83 are formed on the upper side of the color filter layer 70. The first photoresist film 81 has a first sensitivity for light. The second photoresist film 83 has a second sensitivity for light higher than the first sensitivity of the first photoresist film 81 is generally on the upper side of the first photoresist film 81.

In this embodiment, the thickness and the optical refractive coefficient of the second photoresist film 83 may be independently the same as or different from those of the first photoresist film 81. Also, the first photoresist film 81 and the second photoresist film 83 may also have the same melting point (e.g., the films 81 and 83 may exhibit the same or similar properties and/or phenomena when heated). However, the sensitivity of the second photoresist film 83 to light may be about 1.2 times or more (e.g., from about 1.5 times to about 2 times) the sensitivity of the first photoresist film 81.

Figure 14:
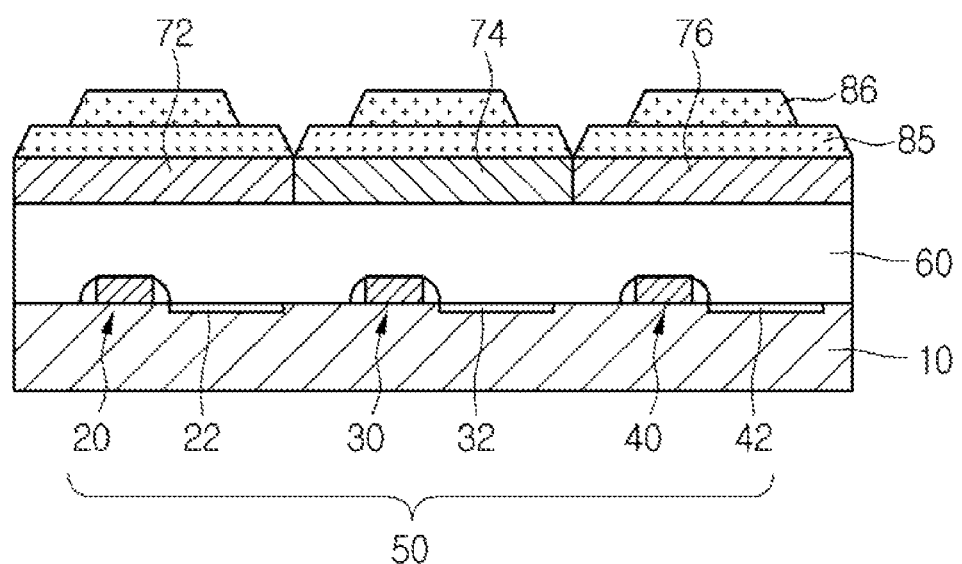
FIG. 14 is a cross-sectional view showing the bilayer photoresist film of FIG. 13 after being exposed and developed according to the fourth embodiment.

FIG. 14 is a view explaining a photoresist film after being exposed according to the fourth embodiment.

Referring to FIG. 14, a pattern mask 130 is aligned on or over the upper surfaces of a first photoresist film 81 and a second photoresist film 83. In this embodiment, the pattern mask 130 has a plurality of light transmitting parts 132.

In this embodiment, the light transmitting parts 132 each are formed on the mask 130 at a location corresponding to the boundaries between first color filter 72 and second color filter 74, and between second color filter 74 and third color filter 76.

The first and second photoresist films 81 and 83 are patterned using the pattern mask 130 to form a lower microlens portion 85 having a first area and a second, upper microlens portion 86 having a second area smaller than the first area. Generally, the second, upper microlens portion 86 is formed on the first microlens 85. In particular, the second photoresist film 83 having higher light sensitivity than the first photoresist film 81 is removed to a greater extent than the first photoresist film 81 so that the second photoresist film 83 has a smaller area than that of the first photoresist film 81.

Meanwhile, the light transmitted through the mask 130 towards the first and second photoresist films 81 and 83 may be focused on the upper surface of the second photoresist film 83. If such light is focused on the upper surface of the second photoresist film 83, the side wall of the developed films 81 and 83 may have a predetermined tilt or angle relative to either the upper or lower surface of films 81 and/or 83 when the first and second photoresist films 81 and 83 are patterned.

Figure 15:
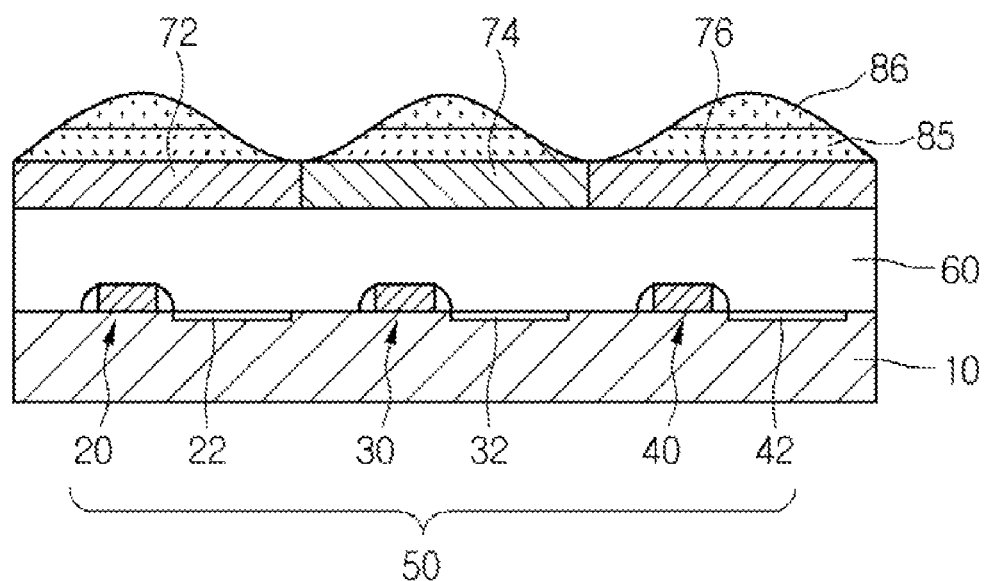
FIG. 15 is a cross-sectional view showing the bilayer microlenses after reflow according to the fourth embodiment.

FIG. 15 is a view explaining the reflow of the microlenses 85/86 according to the fourth embodiment.

Referring to FIG. 15, an aspherical microlens can be manufactured by annealing the first and second microlenses 85 and 86. The image sensor according to the embodiments can make a gap between a microlens and a microlens small, in some cases approaching or equal to zero (0).

Also, the image sensor according to the embodiment can form a microlens in an aspherical shape, making it possible to correct spherical aberration(s) in the microlens(es). For example, the microlenses may have a generally convex shape near the center (e.g., at and/or near the thickest portion[s] of the microlens, particularly in the innermost region of upper microlens portion 86 in the fourth embodiment), a generally concave shape near the edge (e.g., at and/or near the thinnest portion[s] of the microlens, particularly in the outmost region of lower microlens portion 85 in the fourth embodiment), and/or a substantially linear slope in a portion of intermediate thickness (e.g., at and/or near the interface between the upper microlens portion 86 and the lower microlens portion 85 in the fourth embodiment).

As described above, the present invention has advantages related to the capability of forming a microlens having excellent condensing characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor comprising the steps of:
   forming first to third photodiodes and first to third color filters corresponding to the first to third photodiodes;
   forming a photoresist film including photosensitive materials on the upper surfaces of the first to third color filters;
   focus-exposing a first part of the photoresist film using a pattern mask with a light transmitting part corresponding to a first boundary between the first color filter and the second color filter and a second boundary between the second color filter and the third color filter;
   defocus-exposing a second part of the focus-exposed photoresist film using the pattern mask, wherein the second part of the photoresist film has a larger width than the first part; and
   forming microlenses by developing the focus-exposed and defocus-exposed photoresist films.

2. The method according to claim 1, wherein focus-exposing the photoresist film is performed at a first exposure energy, and defocus-exposing the photoresist film is performed at a second exposure energy, the first and second exposure energies being about half of an exposure energy for fully exposing the photoresist film.

3. The method according to claim 2, wherein the first and second exposure energy is 40% to 60% of the exposure energy for fully exposing the photoresist film.

4. The method according to claim 1, wherein the focus-exposed and the defocus-exposed photoresist films uses a single pattern mask.

5. The method according to claim 1, wherein the first to third photodiodes are formed in or on a semiconductor substrate.

6. The method according to claim 1, further comprising forming an insulating layer on the first to third photodiodes.

7. The method according to claim 6, wherein forming the first to third color filters comprises forming a color filter layer on the insulating layer.

8. The method according to claim 6, wherein the insulating layer comprises an oxide, a silicon-rich oxide, a silicon oxycarbide, a hydrogenated silicon oxycarbide, an insulating nitride, or an oxynitride.

9. The method according to claim 8, wherein the insulating layer comprises a silicon dioxide or a silicon dioxide doped with fluorine or boron and/or phosphorous.

10. The method according to claim 9, wherein the insulating layer further comprises a silicon nitride or a silicon oxynitride.

11. The method according to claim 1, further comprising forming a wiring structure in or on the insulating layer.

12. The method according to claim 1, wherein a focus-exposed part of the photoresist film has a relatively larger width at an upper surface of the photoresist film than at a lower surface of the photoresist film.

13. The method according to claim 12, wherein the focus-exposed part has a profile and/or a slope controlled by a focus profile of light passing through the light transmitting part of the pattern mask.

14. The method according to claim 13, wherein the focus profile of light forms a substantially V-shaped focus-exposed part.

15. The method according to claim 13, wherein the focus-exposed part has a depth of about 40% to 60% of the thickness of the photoresist film.

16. The method according to claim 1, wherein forming the microlenses comprises removing focus-exposed and defocus-exposed parts of the photoresist film, and performing a reflow process.

17. The method according to claim 16, wherein removing the focus-exposed and defocus-exposed parts forms first to third microlens precursors on the first to third color filters, respectively, and the reflow process is performed on the first to third microlens precursors.

18. The method according to claim 1, wherein the second part of the photoresist film overlaps the first part of the photoresist film.

* * * * *